(12) United States Patent
Kim et al.

(10) Patent No.: US 7,646,321 B2
(45) Date of Patent: Jan. 12, 2010

(54) DIGITAL/ANALOG CONVERTER

(75) Inventors: Byung Hoon Kim, Suwon-si (KR); Won Tae Choi, Yongin-si (KR)

(73) Assignee: Samsung Electro-Mechanics Co., Ltd, Suwon-Si, Gyunggi-Do (KR)

( * ) Notice: Subject to any disclaimer, the term of this patent is extended or adjusted under 35 U.S.C. 154(b) by 0 days.

(21) Appl. No.: 12/023,805

(22) Filed: Jan. 31, 2008

(65) Prior Publication Data

US 2008/0224911 A1  Sep. 18, 2008

(30) Foreign Application Priority Data

Mar. 14, 2007  (KR) .................. 10-2007-0025232

(51) Int. Cl.
  *H03M 1/66*  (2006.01)
(52) U.S. Cl. .................. 341/145; 341/144; 341/154
(58) Field of Classification Search ................. 341/118, 341/144, 145, 150, 154
  See application file for complete search history.

(56) References Cited

U.S. PATENT DOCUMENTS

| | | | | |
|---|---|---|---|---|
| 4,868,571 A | * | 9/1989 | Inamasu | 341/118 |
| 4,973,979 A | * | 11/1990 | Ikeda | 341/154 |
| 5,731,774 A | * | 3/1998 | Fujii et al. | 341/144 |
| 5,838,273 A | * | 11/1998 | Sauerbrey et al. | 341/145 |
| 5,877,717 A | * | 3/1999 | Tu et al. | 341/150 |
| 5,977,898 A | * | 11/1999 | Ling et al. | 341/144 |
| 6,400,298 B1 | * | 6/2002 | Lee | 341/144 |
| 7,079,062 B2 | * | 7/2006 | Panov et al. | 341/144 |
| 2006/0284752 A1 | * | 12/2006 | Kim et al. | 341/144 |

FOREIGN PATENT DOCUMENTS

| | | |
|---|---|---|
| JP | 11-274936 A | 10/1999 |
| KR | 10-2002-0084933 A | 11/2002 |

* cited by examiner

*Primary Examiner*—Jean B Jeanglaude
(74) *Attorney, Agent, or Firm*—Lowe Hauptman Ham & Berner

(57) ABSTRACT

Provided is a digital/analog converter including a voltage dividing unit that includes a plurality of voltage dividing elements and divides a reference voltage by voltage division; a first decoder that selects a plurality of voltages among the voltages divided by the voltage dividing unit; a first voltage output unit that is connected to nodes among adjacent voltage dividing elements of the voltage dividing unit and the first decoder, and outputs a plurality of voltages selected by the first decoder; a second decoder that selects any one of the plurality of voltages output from the first voltage output unit; and a second voltage output unit that is connected to the first voltage output unit and the second decoder and outputs the voltage selected by the second decoder.

7 Claims, 3 Drawing Sheets

[FIG. 1]
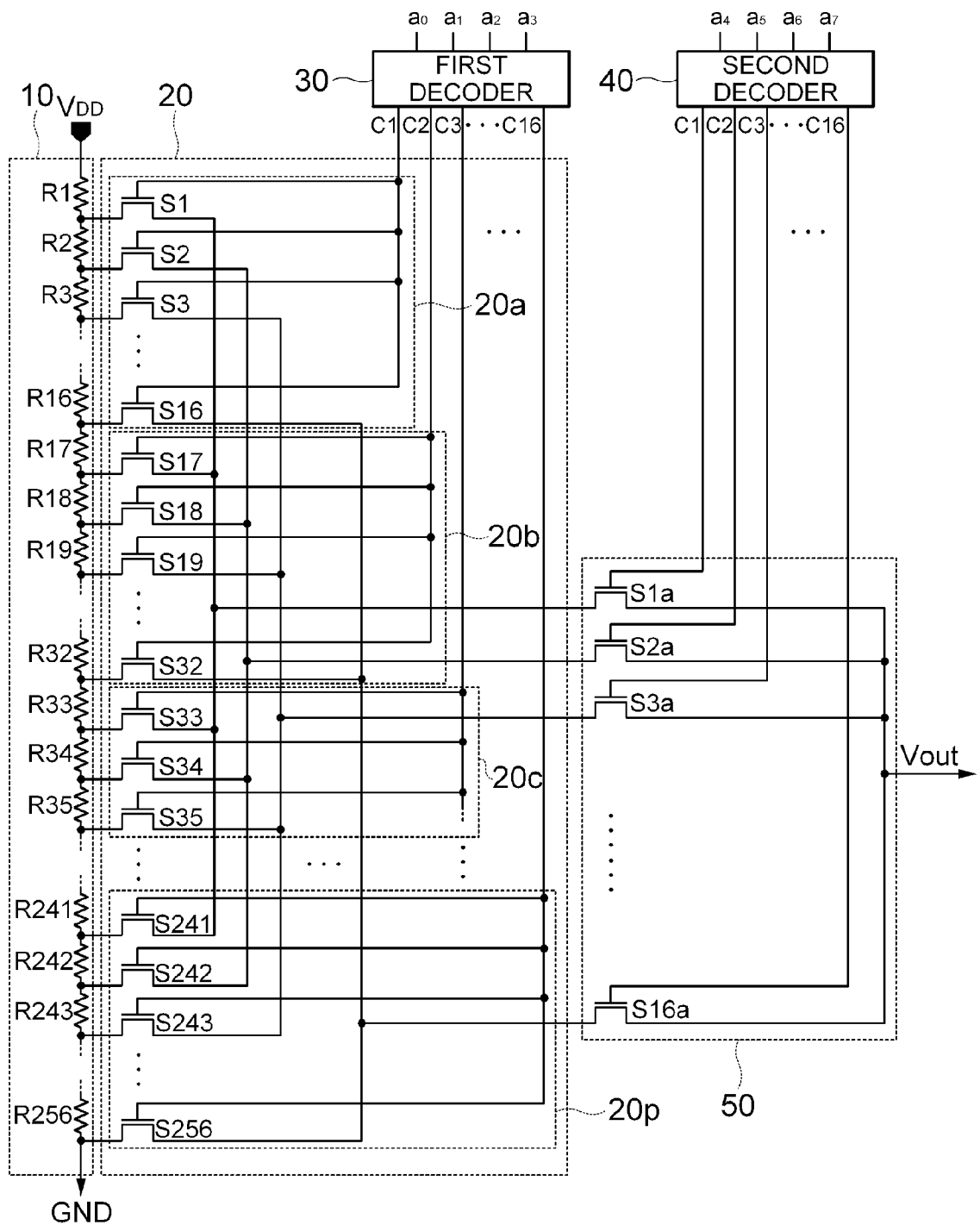

[FIG. 2]
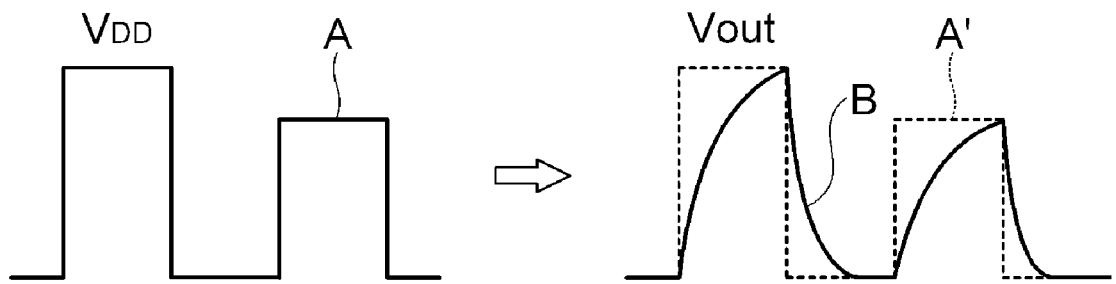
[FIG. 3]
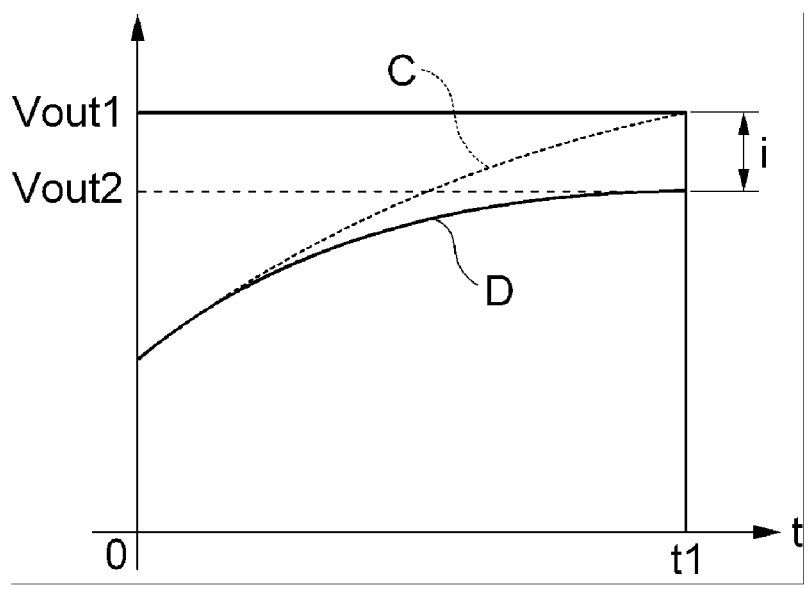

[FIG. 4]
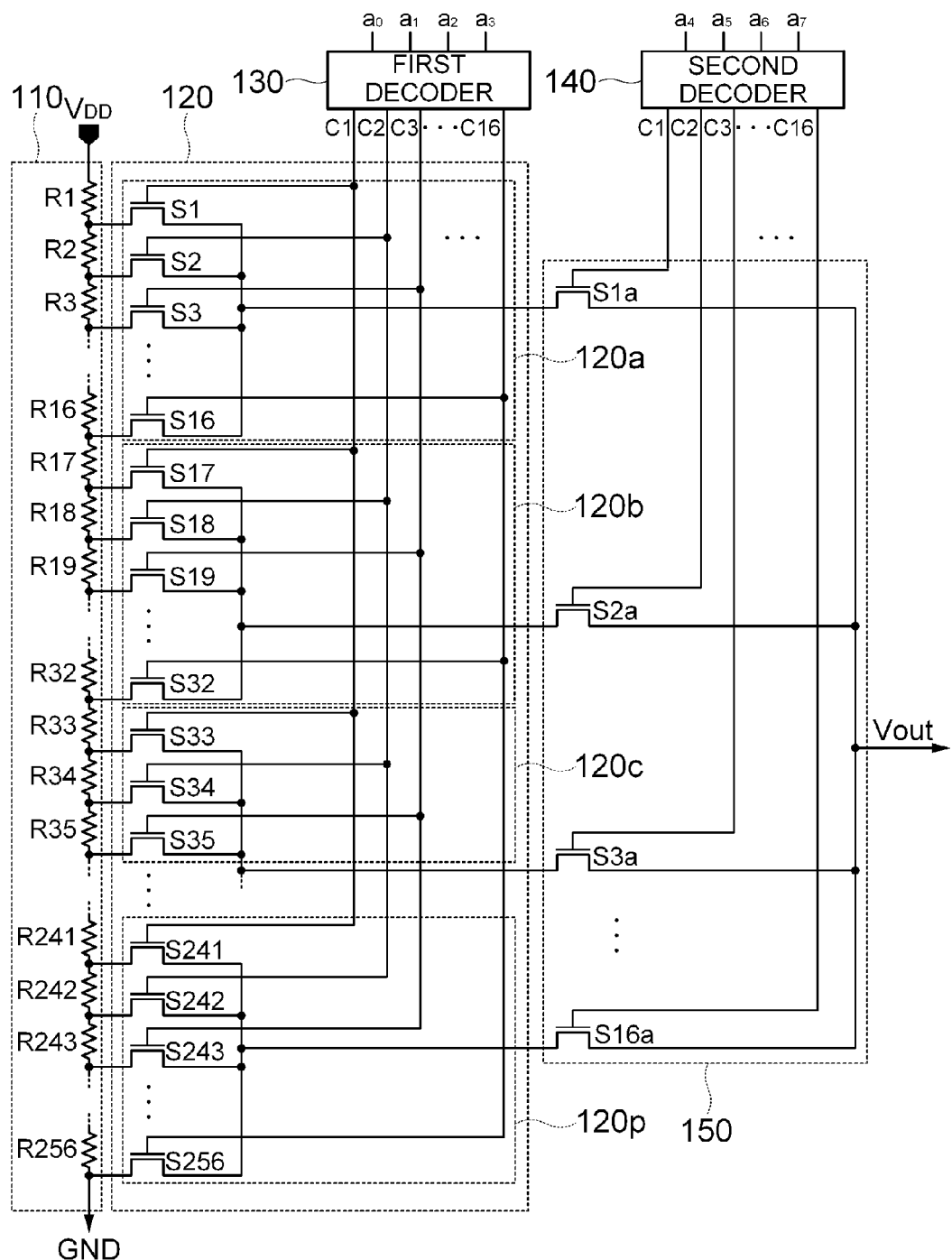

DIGITAL/ANALOG CONVERTER

CROSS-REFERENCE TO RELATED APPLICATIONS

This application claims the benefit of Korean Patent Application No. 10-2007-0025232 filed with the Korea Intellectual Property Office on Mar. 14, 2007, the disclosure of which is incorporated herein by reference.

BACKGROUND OF THE INVENTION

1. Field of the Invention

The present invention relates to a digital/analog converter, and more particularly, to a digital/analog converter capable of controlling adjacent switching elements, of which the number is a multiple of a predetermined number, using one decoder to reduce an RC delay caused by the adjacent voltage dividing elements, thereby improving an operation speed.

2. Description of the Related Art

Digital/analog converters are devices that convert digital signals into analog signals. The digital/analog converter is generally used to convert digital data values into analog signals when a user inputs a digital control code during an image sensing process and sets up the range of digital data values that are stored according to the brightness of images.

In general, a method of using a row of resistors, a method of using capacitors, and a method of using current cells are used to divide a voltage in the digital/analog converter.

However, the known methods have a problem in that an RC delay occurs between adjacent voltage dividing elements, which results in a low operation speed.

Next, the problems of the digital/analog converter according to the related art will be described in detail with reference to the accompanying drawings.

FIG. 1 is a circuit diagram illustrating a digital/analog converter according to the related art, FIG. 2 is a diagram illustrating an RC delay of the digital/analog converter according to the related art, and FIG. 3 is a diagram illustrating a grayscale error of the digital/analog converter according to the related art.

First, as shown in FIG. 1, the digital/analog converter according to the related art includes: a voltage dividing unit 10 that includes a plurality of voltage dividing elements; a first decoder 30 that selects a plurality of voltages among the voltages divided by the voltage dividing unit 10; a first voltage output unit 20 that is connected to the voltage dividing unit 10 and the first decoder 30 and is controlled by the first decoder 30 to output a plurality of voltages divided by the voltage dividing unit 10; a second decoder 40 that selects a predetermined voltage from the plurality of voltages output from the first voltage output unit 20; and a second voltage output unit 50 that is connected to the first voltage output unit 20 and the second decoder 40 and is controlled by the second decoder 40 to output a predetermined voltage among the plurality of voltages output from the first voltage output unit 20.

The voltage dividing unit 10 includes 256 voltage dividing elements R1 to R256 connected in series to one another, and has one end supplied with a reference voltage $V_{DD}$ and the other end connected to the ground GND of the circuit. In addition, predetermined divided voltages are output from nodes among the voltage dividing elements R1 to R256. In this case, resistors, capacitors, or current cells may be used as the plurality of voltage dividing elements R1 to R256.

The first voltage output unit 20 includes a plurality of voltage selecting units 20a to 20p, and the voltage selecting units 20a to 20p each include 16 switching elements S1 to S16, ... S241 to S256 that are connected to the corresponding nodes in each group of 16 voltage dividing elements among the voltage dividing elements R1 to R256 of the voltage dividing unit 10.

For example, the first voltage selecting unit 20a includes the first to sixteenth switching elements S1 to S16 that are connected to the corresponding nodes among the first to sixteenth voltage dividing elements R1 to R16, and the second voltage selecting unit 20b includes the seventeenth to thirty-second switching elements S17 to S32 that are connected to the corresponding nodes among the seventeenth to thirty-second voltage dividing elements R17 to R32. In particular, the switching elements S1 to S256 of each of the first to sixteenth voltage selecting units 20a to 20p are connected to the same output terminal of the first decoder 30 such that they are simultaneously controlled by the first decoder 30.

Further, the first decoder 30 receives a digital signal of 8 bits $a_0$ to $a_7$ from the outside and is controlled by four most significant bits $a_0$ to $a_3$ of the digital signal to select any one of the 16 voltage selecting units 20a to 20p.

That is, the first decoder 30 outputs a high-level selection signal to any one of the 16 output terminals C1 to C16 by the four most significant bits $a_0$ to $a_3$ of the digital signal of 8 bits $a_0$ to $a_7$ received from the outside, and one of the 16 voltage selecting units 20a to 20p having received the high-level selection signal outputs a divided voltage from the voltage dividing unit 10 connected thereto.

Furthermore, the second decoder 40 outputs a high-level selection signal to any one of the 16 output terminals C1 to C16 by four least significant bits $a_4$ to $a_7$ of the digital signal of 8 bits $a_0$ to $a_7$ received from the outside to select any one of the 16 voltages output from the first voltage output unit 20.

The second voltage output unit 50 includes a plurality of switching elements S1a to S16a, and each of the plurality of switching elements S1a to S16a has a gate connected to a corresponding one of the output terminals C1 to C16 of the second decoder 40 and one end connected to the first voltage output unit 20. Therefore, the switching elements S1a to S16a are turned on or off by selection signals output from the second decoder 40. When any one of the switching elements S1a to S16a is turned on by the second decoder 40, a voltage Vout is output from the second voltage output unit 50.

If the first decoder 30 outputs the high-level selection signal to the first output terminal C1 by four most significant bits of the digital signal of 8 bits $a_0$ to $a_7$ received from the outside, all the switching elements S1 to S16 of the first voltage selecting unit 20a having received the high-level selection signal are turned on, and the voltages divided by the first to sixteenth voltage dividing elements R1 to R16 are output.

If the second decoder 40 outputs the high-level selection signal to the second output terminal C2 by four least significant bits of the digital signal of 8 bits $a_0$ to $a_7$, the switching element S2a of the second voltage output unit 50 having received the high-level selection signal is turned on, and the voltage divided by the second voltage dividing element R2 among the voltages output from the first voltage selecting unit 20a is output as a final output voltage Vout.

However, in the digital/analog converter having the above-mentioned structure according to the related art, since the voltages divided by 16 adjacent voltage dividing elements among the voltage dividing elements R1 to R256 are selected by the first decoder 30 and then output by the first voltage output unit 20 at the same time, the voltages are affected by the adjacent voltage dividing elements, resulting in an RC delay.

In this case, as shown in FIG. 2, when the user wants a data waveform A, a waveform A' is not output, but a waveform B having a time delay to reach a peak value due to the RC delay is output, which results in delay in operation.

As a result, as shown in FIG. 3, even though a voltage corresponding to Vout1 is output at a time t1, a voltage Vout2 lower than the voltage Vout1 is output at the time t1 due to the RC delay caused by 16 adjacent voltage dividing elements R1 to R16, . . . , R241 to R256, which makes it difficult to accurately represent desired brightness and color, resulting in a grayscale error.

SUMMARY OF THE INVENTION

An advantage of the present invention is that it provides a digital/analog converter capable of controlling adjacent switching elements, of which the number is a multiple of a predetermined number, using one decoder to reduce an RC delay caused by the adjacent voltage dividing elements, thereby improving an operation speed.

Additional aspects and advantages of the present general inventive concept will be set forth in part in the description which follows and, in part, will be obvious from the description, or may be learned by practice of the general inventive concept.

According to an aspect of the invention, a digital/analog converter includes: a voltage dividing unit that includes a plurality of voltage dividing elements and divides a reference power supply voltage by voltage division; a first decoder that selects a plurality of voltages among the voltages divided by the voltage dividing unit; a first voltage output unit that is connected to nodes among adjacent voltage dividing elements of the voltage dividing unit and the first decoder, and outputs a plurality of voltages selected by the first decoder; a second decoder that selects any one of the plurality of voltages output from the first voltage output unit; and a second voltage output unit that is connected to the first voltage output unit and the second decoder and outputs the voltage selected by the second decoder.

Preferably, the voltage dividing elements are a plurality of resistors, capacitors, or current cells connected in series to one another.

Preferably, the first voltage output unit includes a plurality of voltage selecting units each having a plurality of switching elements that are connected to the nodes of the voltage dividing unit.

Preferably, each of the voltage selecting units includes the switching elements which are connected to one another through the first decoder and whose number is a multiple of a predetermined number.

Preferably, the switching elements are transistors or MOSFETs.

Preferably, each of the switching elements has a gate connected to the first decoder, a drain connected to the corresponding node of the voltage dividing unit, and a source connected to a node of the voltage selecting unit.

Preferably, the second voltage output unit includes a plurality of switching elements that are connected to the first voltage output unit and the second decoder and are controlled by the second decoder.

Preferably, the switching elements are transistors or MOSFETs.

Preferably, the plurality of switching elements have gates that are connected to the second decoder, drains that are connected to the voltage selecting unit, and sources that are commonly connected.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a circuit diagram illustrating a digital/analog converter according to the related art;

FIG. 2 is a diagram illustrating an RC delay of the digital/analog converter according to the related art;

FIG. 3 is a diagram illustrating a grayscale error of the digital/analog converter according to the related art; and FIG. 4 is a circuit diagram schematically illustrating a digital/analog converter according to an embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, a digital/analog converter according to an embodiment of the invention will be described in detail with reference to the accompanying drawings.

FIG. 4 is a circuit diagram schematically illustrating the digital/analog converter according to the embodiment of the invention.

First, as shown in FIG. 4, the digital/analog converter according to the embodiment of the invention includes: a voltage dividing unit 110 that includes a plurality of voltage dividing elements R1 to R256 and divides a reference voltage $V_{DD}$ supplied from the outside using the voltage dividing elements R1 to R256; a first decoder 130 that selects a plurality of voltages from the voltages divided by the voltage dividing unit 110; a first voltage output unit 120 that is connected to nodes among a plurality of adjacent voltage dividing elements R1 to R256 of the voltage dividing unit 110 and the first decoder 130, and outputs a plurality of voltages selected by the first decoder 130; a second decoder 140 that selects any one of the plurality of voltages output from the first voltage output unit 120; and a second voltage output unit 150 that is connected to the first voltage output unit 120 and the second decoder 140 and outputs the voltage selected by the second decoder 140.

In the voltage dividing unit 110, the plurality of voltage dividing elements R1 to R256 are connected in series to one another, and each of the voltage dividing elements R1 to R256 has one end that is supplied with the reference voltage $V_{DD}$ and the other end that is connected to the ground of the circuit. In addition, predetermined divided voltages are output from the nodes among the voltage dividing elements R1 to R256. In this case, the plurality of voltage dividing elements R1 to R256 are formed of resistors, capacitors, or current cells.

In this embodiment, in order to output 256 voltages, 256 voltage dividing elements R1 to R256 are used in the digital/analog converter, but the invention is not limited to the voltage dividing elements R1 to R256. For example, in order to output 1024 voltages, 1024 voltage dividing elements may be used in the digital/analog converter.

To clarify the description, components other than the voltage dividing elements R1 to R256 are configured to output 256 voltages in the digital/analog converter, but the invention is not limited thereto. For example, the structure of the components may be changed or modified to output voltage levels smaller than or larger than 256 voltages.

The first voltage output unit 120 includes a plurality of voltage selecting units, that is, first to sixteenth voltage selecting units 120a to 120p, and is connected to the voltage dividing unit 110 and the first decoder 130. The first voltage output unit 120 is controlled by the first decoder 130 to select and output a plurality of voltages among the voltages divided by the voltage dividing unit 110.

The plurality of voltage selecting units 120a to 120p each include a plurality of switching elements S1 to S16, ..., S241 to S256. Each of the switching elements S1 to S16, ..., S241 to S256 has one end that is connected to a node between the adjacent voltage dividing elements R1 to R256, the other end that is connected to a node of a corresponding one of the voltage selecting units 120a to 120p, and a control terminal that is connected to the first decoder 130. Therefore, the voltage selecting units 120a to 120p are turned on or off by the first decoder 130 to output voltages.

Specifically, the first voltage selecting unit 120a includes the first to sixteenth switching elements S1 to S16. The first switching element S1 has a gate connected to a first output terminal C1 of the first decoder 130, a drain connected to a node between the first voltage dividing element R1 and the second voltage dividing element R2, and a source connected to the sources of the second to sixteenth switching elements S2 to S16, that is, a node of the first voltage selecting unit 120a. The second switching element S2 has a gate connected to a second output terminal C2 of the first decoder 130, a drain connected to a node between the second voltage dividing element R2 and the third voltage dividing element R3, and a source connected to the sources of the first switching element S1 and the third to sixteenth switching elements S3 to S16.

The second voltage selecting unit 120b includes the seventeenth to thirty-second switching elements S17 to S32. The seventeenth switching element S17 has a gate connected to the first switching element S1 and the first output terminal C1 of the first decoder 130, a drain connected to a node between the seventeenth voltage dividing element R17 and the eighteenth voltage dividing element R18, and a source connected to the sources of the eighteenth to thirty-second switching elements S18 to S32.

Therefore, the first to sixteenth voltage selecting units 120a to 120p each include 16 switching elements S1 to S16, ..., S241 to S256. The number of switching elements S1 to S16, ..., S241 to S256 provided in each of the first to sixteenth voltage selecting units 120a to 120p is a multiple of a predetermined number (a multiple of 16 in this embodiment), and the gates of the switching elements in each of the first to sixteenth voltage selecting units 120a to 120p are connected to the corresponding output terminals C1 to C16 of the first decoder 130. Therefore, the switching elements S1 to S256 connected to one of the output terminals C1 to C16 of the first decoder 130 that outputs a high-level selection signal are turned on, and thus only one switching element in each of the first to sixteenth voltage selecting units 120a to 120p is turned on. As a result, the first voltage output unit 120 outputs voltages corresponding to the switching elements that are in the on state, among the voltages divided by the voltage dividing unit 110. In this case, transistors or MOSFETs are used as the switching elements S1 to S256.

The above-mentioned operation can effectively prevent an RC delay due to a resistance component and parasitic capacitance caused by the adjacent voltage dividing elements R1 to R256 when any one of the first to sixteenth voltage selecting units 20a to 20p is selected by the first decoder 30 and all the switching elements of the selected voltage selecting unit are turned on, unlike the related art.

That is, in the first voltage output unit 120 of the digital/analog converter according to this embodiment, the gates of the switching elements S1 to S16, ..., S241 to S256 in each of the first to sixteenth voltage selecting units 120a to 120p are not connected to any one of the output terminals C1 to C16 of the first decoder 130, unlike the related art. However, the number of switching elements provided in each of the voltage selecting units 120a to 120p is a multiple of a predetermined number, and the gates of the switching elements S1 to S16, ..., S241 to S256 in each of the voltage selecting units 120a to 120p are connected to the corresponding output terminals C1 to C16 of the first decoder 130, respectively. In this way, only one of the 16 switching elements provided in each of the voltage selecting units 120a to 120p is turned on, and the other switching elements are turned off. As a result, it is possible to prevent an RC delay due to a resistance component of the adjacent voltage dividing elements R1 to R256 and parasitic capacitance generated between the adjacent voltage dividing elements R1 to R256.

Therefore, in the digital/analog converter according to this embodiment, the first voltage output unit 120 can reduce the RC delay, and shorten the time required to select and output the voltages divided by the voltage dividing unit 110. As a result, it is possible to obtain an operation speed that is five times faster than that in the related art.

The first decoder 130 receives a digital signal of 8 bits $a_0$ to $a_7$ from the outside, and is controlled by four most significant bits $a_0$ to $a_3$ of the received digital signal to output a high-level selection signal to any one of the 16 output terminals C1 to C16 and low-level selection signals to the other output terminals.

The second decoder 140 is controlled by four least significant bits $a_4$ to $a_7$ of the digital signal of 8 bits $a_0$ to $a_7$ to output a high-level selection signal to any one of the 16 output terminals C1 to C16 and low-level selection signals to the other output terminals.

The second voltage output unit 150 includes a plurality of switching elements S1a to S16a, and each of the switching elements S1a to S16a has a control terminal connected to the second decoder 140 and one end connected to the first voltage output unit 120. Therefore, the switching elements S1a to S16a are turned on or off by the second decoder 140 to select and output any one of a plurality of voltages output from the first voltage output unit 120.

Specifically, in the second voltage output unit 150, the first switching element S1a has a gate connected to the first output terminal C1 of the second decoder 140, a drain connected to the first voltage selecting unit 120a, and a source connected to the sources of the second to sixteenth switching elements S2a to S16a. The second switching element S2a has a gate connected to the second output terminal C2 of the second decoder 140, a drain connected to the second voltage selecting unit 120b, and a source connected to the sources of the first switching element S1a and the third to sixteenth switching elements S3a to S16a. In this case, transistors or MOSFETs are used as the plurality of switching elements S1a to S16a.

Next, the operation of the digital/analog converter having the above-mentioned structure according to this embodiment will be described below. Four most significant bits $a_0$ to $a_3$ of the digital signal of 8 bits $a_0$ to $a_7$ received from the outside are input to the first decoder 130, and four least significant bits $a_4$ to $a_7$ of the digital signal are input to the second decoder 140, thereby outputting a high-level selection signal to any one of the 16 output terminals C1 to C16 corresponding to the digital signal of 8 bits $a_0$ to $a_7$.

When the high-level selection signal is output to the third output terminal C3 of the first decoder 130, the third switching element S3, S19, ..., S243 in each of the first to sixteenth voltage selecting units 120a to 120p is turned on, and the divided voltages are output through the third, nineteenth, ..., two hundred forty-third voltage dividing elements R3, R19, ..., R243.

When the high-level selection signal is output to the sixteenth output terminal C16 of the second decoder 140 by the four least significant bits $a_4$ to $a_7$ of the digital signal of 8 bits $a_0$ to $a_7$, the sixteenth switching element S16a is turned on, and the divided voltage is output as a final output voltage Vout through the two hundred forty-third switching element S243 of the sixteenth voltage selecting unit 120p. As a result, it is possible to reduce the RC delay due to the adjacent voltage dividing elements R1 to R256 and thus improve the operation speed of the digital/analog converter.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

As described above, in the digital/analog converter according to the invention, one decoder controls the switching elements whose number is a multiple of a predetermined number to select voltages that are divided at an interval of a multiple of a predetermined number. Therefore, it is possible to reduce the RC delay caused by a resistance component between adjacent voltage dividing elements and parasitic capacitance generated between the voltage dividing elements, and thus improve the operation speed of a circuit.

What is claimed is:

1. A digital/analog converter comprising:
a voltage dividing unit that includes a plurality of voltage dividing elements and divides a reference power supply voltage by voltage division;
a first decoder that selects a plurality of voltages among the voltages divided by the voltage dividing unit;
a first voltage output unit that is connected to nodes among adjacent voltage dividing elements of the voltage dividing unit and the first decoder, and outputs the plurality of voltages selected by the first decoder;
a second decoder that selects any one of the plurality of voltages output from the first voltage output unit; and
a second voltage output unit that is connected to the first voltage output unit and the second decoder, and outputs the voltage selected by the second decoder,
wherein the first voltage output unit includes a plurality of voltage selecting units each having a plurality of switching elements that are connected to the nodes of the voltage dividing unit, and
wherein each of the voltage selecting units includes the switching elements which are connected to one another through the first decoder and of which the number is a multiple of a predetermined number.

2. The digital/analog converter according to claim 1, wherein the voltage dividing elements are a plurality of resistors, capacitors, or current cells connected in series to one another.

3. The digital/analog converter according to claim 1, wherein the switching elements are transistors or MOSFETs.

4. The digital/analog converter according to claim 3, wherein each of the switching elements has a gate connected to the first decoder, a drain connected to the corresponding node of the voltage dividing unit, and a source connected to a node of the voltage selecting unit.

5. The digital/analog converter according to claim 1, wherein the second voltage output unit includes a plurality of switching elements that are connected to the first voltage output unit and the second decoder and are controlled by the second decoder.

6. The digital/analog converter according to claim 5, wherein the switching elements are transistors or MOSFETs.

7. The digital/analog converter according to claim 5, wherein the plurality of switching elements have gates that are connected to the second decoder, drains that are connected to the voltage selecting unit, and sources that are commonly connected.

* * * * *